(12) United States Patent
Elwell et al.

(10) Patent No.: US 9,987,973 B2
(45) Date of Patent: Jun. 5, 2018

(54) LED ACCESSORY FOR VEHICLE

(71) Applicant: PUTCO, INC., Des Moines, IA (US)

(72) Inventors: James P. Elwell, Grimes, IA (US); Trent Quick, Des Moines, IA (US)

(73) Assignee: Putco, Inc., Des Moines, IA (US)

( * ) Notice: Subject to any disclaimer, the term of this patent is extended or adjusted under 35 U.S.C. 154(b) by 0 days. days.

(21) Appl. No.: 14/930,657

(22) Filed: Nov. 2, 2015

(65) Prior Publication Data

US 2017/0297480 A1    Oct. 19, 2017

(51) Int. Cl.
| | |
|---|---|
| *F21V 5/00* | (2018.01) |
| *B60Q 1/24* | (2006.01) |
| *H05K 1/18* | (2006.01) |
| *H05K 3/28* | (2006.01) |
| *F21V 29/89* | (2015.01) |
| *F21S 8/10* | (2006.01) |
| *F21S 4/28* | (2016.01) |
| *F21V 19/00* | (2006.01) |
| *F21Y 115/10* | (2016.01) |
| *B60Q 1/20* | (2006.01) |

(52) U.S. Cl.
CPC .................. *B60Q 1/24* (2013.01); *F21S 4/28* (2016.01); *F21S 48/328* (2013.01); *F21S 48/33* (2013.01); *F21V 5/007* (2013.01); *F21V 19/003* (2013.01); *F21V 29/89* (2015.01); *H05K 1/181* (2013.01); *H05K 3/284* (2013.01); *H05K 3/288* (2013.01); *B60Q 1/20* (2013.01); *F21Y 2115/10* (2016.08); *H05K 2201/10106* (2013.01)

(58) Field of Classification Search
CPC .. B60Q 1/24; B60Q 1/20; F21V 29/89; F21V 5/007; F21V 19/003; F21S 4/28; F21S 48/328; F21S 48/33; H05K 1/181; H05K 3/284; H05K 3/288; H05K 2201/10106; F21Y 2115/10
USPC ......................................................... 362/520
See application file for complete search history.

(56) References Cited

U.S. PATENT DOCUMENTS 7,950,821 B1 *   5/2011   Georgitsis ............ B60Q 1/0483
                                                              362/217.12

\* cited by examiner

*Primary Examiner* — Anh Mai
*Assistant Examiner* — Hana Featherly
(74) *Attorney, Agent, or Firm* — McKee, Voorhees & Sease, PLC (57) ABSTRACT

A lighted accessory for a motor vehicle includes a machined aluminum body. The body includes a front wall that has a plurality of openings through it and a cavity behind it. A plurality of lenses are potted in place within the openings. LED lights are installed on the aluminum body in alignment with the lenses. Additional potting compound is applied to cover the LEDs and substantially fill the cavity. A faulty LED board may be replaced by removing a portion of the potting compound and the faulty LED board, replacing the faulty LED board with an operable one, and refilling the removed portion of the potting compound with additional potting compound.

13 Claims, 8 Drawing Sheets

LED ACCESSORY FOR VEHICLE

CROSS-REFERENCE TO RELATED APPLICATIONS

This application claims priority under 35 U.S.C. § 119 to provisional application Ser. No. 62/073,825 filed Oct. 31, 2014, herein incorporated by reference in its entirety.

FIELD OF INVENTION

The present invention relates to lighted accessories for motor vehicles. More specifically, the present invention relates to an improved LED accessory for a motor vehicle, and a method for assembling the improved LED accessory.

BACKGROUND OF THE INVENTION

Lighted accessories for vehicles, such as cars and trucks, have become popular in recent years. This is especially true with respect to aftermarket products that permit a vehicle owner to personalize his or her vehicle. These lighted accessories may take the form of light bars that include a single, or multiple rows of lights. The light bars may be installed at various locations to provide a decorative affect. Additionally, these lighted accessories may be used as replacements for original equipment lighting, such as headlights, fog lights, tail lights, and turn signals. Even more recently, it has become possible to use light emitting diodes (LEDs) within these lighted accessories.

To date, the LED lighted vehicle accessories have suffered from some common disadvantages. For example, the accessories have tended to be rather bulky, especially in a front-to-back dimension, which can limit the places where such accessories can be installed. For example, published United States patent application U.S. 2014/0078762 A1 shows a light fixture with a curved frame. As can be seen in the drawings of U.S. 2014/0078762 A1, the overall depth of the product from front to back is significant. Additionally, current LED lighted vehicle accessories have faced durability issues, often times relating to water, dust, or other contaminants fouling the electronics. Many of the devices emit a humming or buzzing noise as a result of vibration within the device. The devices can also be difficult or impossible to repair in case one or more of the circuit boards goes bad.

Accordingly, there is a need for an improved LED lighted vehicle accessory.

It is an object of the present invention to provide a lighted vehicle accessory that uses LEDs, and has a reduced depth from front to rear.

It is a further object of the present invention to provide an LED lighted vehicle accessory that has improved durability.

It is another object of the present invention to provide an LED lighted vehicle accessory that better protects the electronic components from water damage.

It is another object of the present invention to provide an LED lighted vehicle accessory that can be repaired conveniently by replacing one or more circuit boards.

It is yet another object of the present invention to provide an improved LED lighted vehicle accessory that emits little or no humming noise.

SUMMARY OF THE INVENTION

According to one embodiment the present invention is directed to a lighted accessory for a vehicle. The accessory includes an aluminum body that has a front wall and a cavity behind the front wall. The front wall has a plurality of openings. A plurality of lenses are provided within the plurality of openings. A potting adhesive forms a water tight seal between the lenses and the front wall. A circuit board is provided within the cavity and includes a plurality of light emitting diodes in alignment with the plurality of lenses. A second layer of potting adhesive covers the circuit board and substantially fills the cavity. A back cover is secured to the body spaced apart from the front wall and covering the second layer of potting adhesive. An attachment assembly is secured to the body. The attachment assembly is adapted to attach the body to a vehicle. A wire harness is connected to the circuit board and adapted to attach to an electrical system of a vehicle. The aluminum body may be formed from anodized aluminum.

According to another embodiment, the present invention is a method of assembling a lighted vehicle accessory. A solid block of aluminum is machined to form an accessory body having a front wall, a cavity behind the front wall, an opening through the front wall, and a lens receptacle on a rear surface of the front wall surrounding the opening. A lens is placed in the lens receptacle in alignment with the opening, and a first layer of potting compound is applied around the lens in the lens receptacle to secure the lens in place and to form a watertight seal between the lens and the body. The first layer of potting compound is allowed to at least partially cure. A circuit board that includes a light emitting diode (LED) is secured to the rear surface of the front wall with the LED in alignment with the lens. The cavity is substantially filled with a second layer of potting compound to completely cover the circuit board within the cavity. The second layer of potting compound is allowed to at least partially cure. A rear cover is attached to the body to at least partially cover the at least partially cured second layer of potting compound.

According to another embodiment, the present invention is a method of repairing a lighted vehicle accessory that includes a plurality of circuit boards when one of the circuit boards is faulty. First, a determination is made that that at least one of its LED lights is non-functioning. A circuit board within the accessory that corresponds with the non-functioning LED light is identified. A cutting device is used to cut a portion of a layer of potting compound covering the identified circuit board and the cut portion of the layer of potting compound is peeled away to expose the identified circuit board. The identified circuit board is replaced with a replacement circuit board. The replacement circuit board is covered with a new layer of potting compound. The rear cover is reattached to the accessory after allowing the new layer of potting compound to at least partially cure.

DETAILED DESCRIPTION OF PREFERRED EMBODIMENTS

Figure 1:
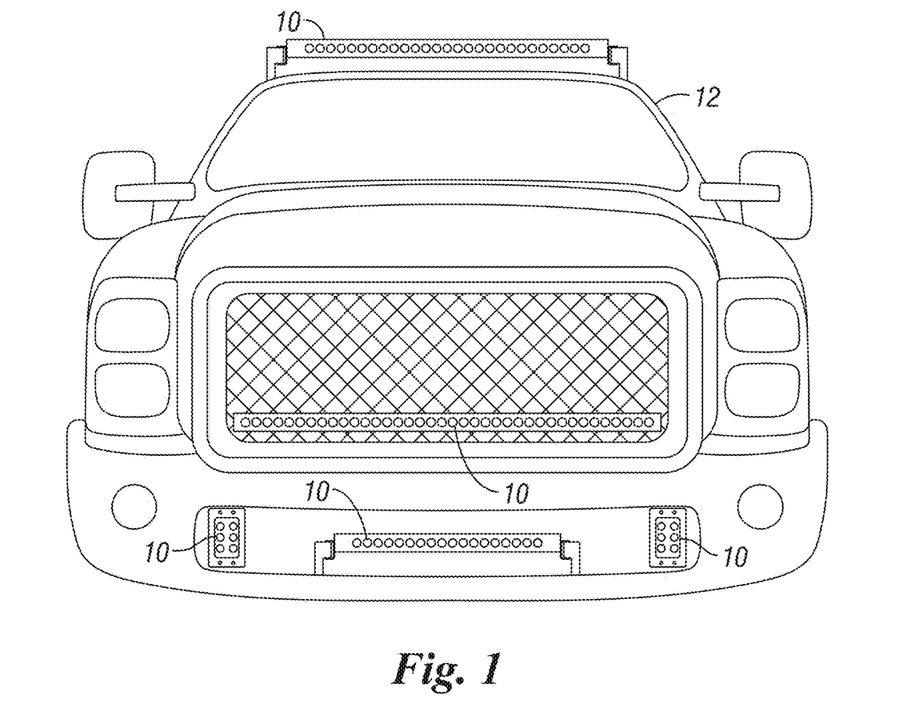
FIG. 1 is a front view of a motor vehicle with lighted vehicle accessories attached according to the present invention.

FIG. 1 is a front view of a vehicle 12 that includes several lighted accessories 10. As can be seen, the lighted accessory 10 may take the form of an elongated bar mounted on the roof of the vehicle, an elongated bar mounted at vehicle grill, a light bar provided on the bumper, or as fog lights. Those skilled in the art will be aware of numerous possible locations and configurations for lighted vehicle accessories. According to the present invention, the lighted accessory 10 is an LED lighted accessory of improved construction. The lighted accessories 10 may be connected to the vehicle's electrical system. Typically, a user will be able to control illumination of the lighted accessories 10 through the existing lighting controls of the vehicle 12.

Figure 2:
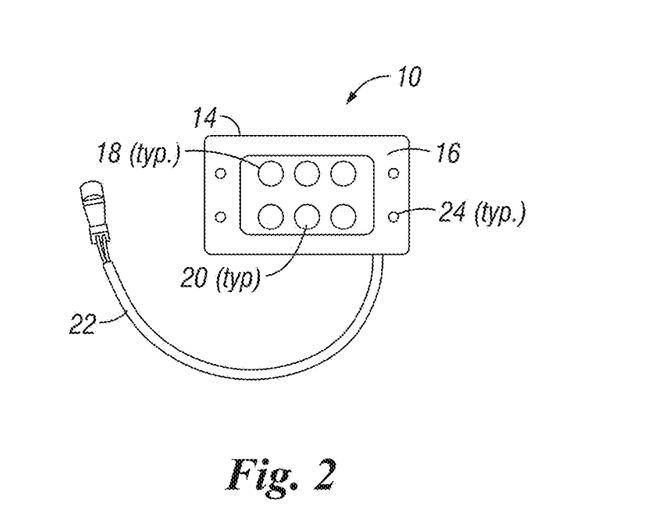
FIG. 2 shows a lighted vehicle accessory that includes two rows of three LEDs according to one embodiment of the present invention.

FIG. 2 shows an LED lighted accessory 10 according to one embodiment of the present invention. The lighted accessory 10 includes a rectangular body 14. The front face 16 of the body 14 is visible in FIG. 2. The front face 16 of the body 14 includes a plurality of openings 18. In the embodiment of FIG. 2 there are six total openings 18 provided in two rows of three openings. Within each of the openings 18 a lens 20 is mounted, and through which light from a light source will shine. The accessory 10 also includes a wire harness 22 that is adapted to be connected into the vehicle's electrical system to provide power to the lights. The lighted accessory 10 also includes mounting holes 24 to provide for mounting the lighted accessory 10 to the vehicle 12.

Figure 3:
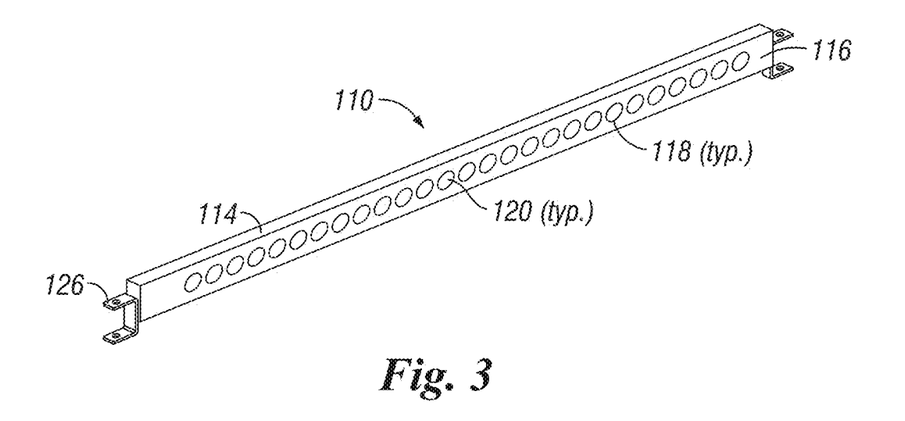
FIG. 3 shows a lighted vehicle accessory according to another embodiment of the present invention, wherein the accessory is an elongated LED light bar.

FIG. 3 shows another embodiment of a lighted accessory 110 according to the present invention. The lighted accessory 110 of FIG. 3 is an elongated bar that includes a single row of lights. The lighted accessory 110 of FIG. 3 also includes a body 114 preferably made from aluminum. The body 114 includes a front face 116 including a row of openings 118. Each of the openings 118 is provided with a lens 120 through which light from the LEDs shines. While not visible in FIG. 3, the lighted accessory 110 of FIG. 3 also includes a wire harness for connection to the vehicle's electrical system. Each end of the lighted accessory 110 of FIG. 3 includes mounting hardware 126, which is used to mount the light bar 110 to the vehicle, for example to mount the light bar 110 to a vehicle grill.

Figure 4:
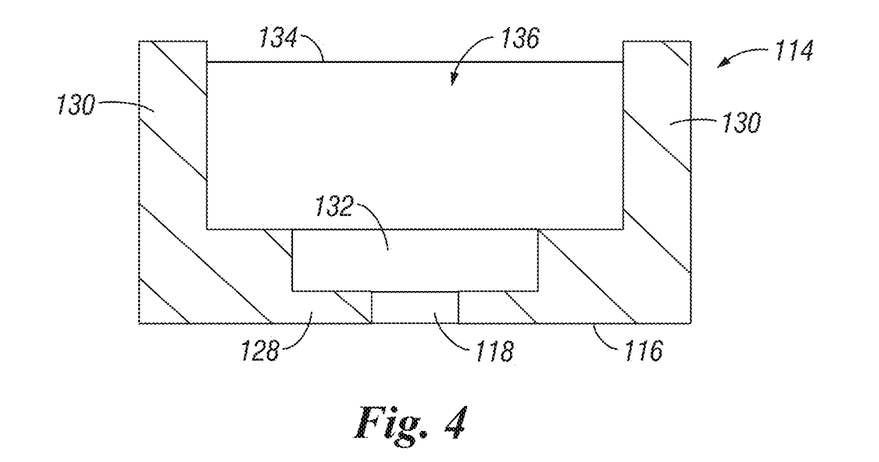
FIG. 4 is a cross sectional view of a machined aluminum body used in the elongated light bar of FIG. 3.

FIG. 4 shows a cross sectional view of the body 114 of the lighted accessory 110 from FIG. 3. The body 114 is preferably made from a single piece of anodized aluminum that has been machined into a desired configuration using a CNC machine. A cavity 136 is machined into the body 114 to form the top and bottom walls 130, the front wall 128, and the side walls 134. The body 114 includes a front wall 128 and rearwardly extending top and bottom walls 130. One of the openings 118 through the front wall 128 is shown in FIG. 4. The overall thickness of the body 114 from the front face 116 to the back face of the walls 130 is preferably no more than one and one-half inches, and may be as small as three quarters of an inch. A recessed area is machined into the front wall 128 to form a lens receptacle 132. The body 114 may be formed as a generally straight flat prismatic shape, or may be curved to match a contour of the vehicle or space on the vehicle where it is intended to be mounted.

Figure 5:
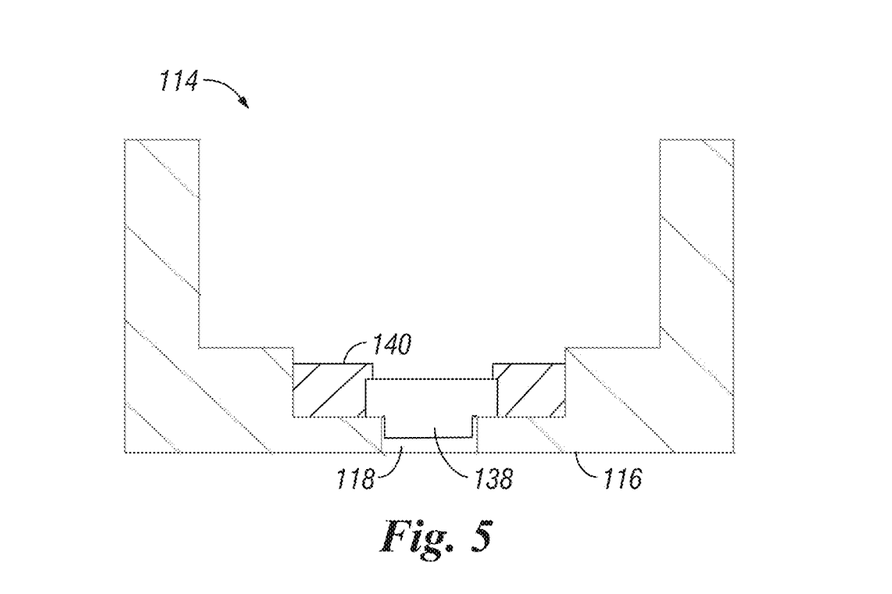
FIG. 5 shows the aluminum body of FIG. 4 with a lens potted into place within an opening of the front wall of the aluminum body.

FIG. 5 shows the lighted accessory body 114 of FIG. 4 at an early stage of the assembly process wherein a lens 138 has been inserted into the lens receptacle 132 in alignment with the opening 118. As shown in FIG. 5, the opening 118 is machined at a right angle to the front face 116. This standard orientation for the opening 118 causes the lens 138 to be oriented normally with respect to the front face 116, and to generally direct the light at a right angle to the front face 116. As an alternative (not shown) the opening 118 may be machined at an oblique angle relative to the front face 116 in order to direct the light in a direction other than simply a right angle from the face 116. A potting adhesive 140 is applied around the periphery of the lens 138 within the lens receptacle 132 in order to secure the lens 138 in place, and to form a watertight seal to prevent any water or other contaminants from entering the lighted accessory through the opening 118. The potting adhesive 140 may be a high elongation epoxy that is self-leveling, for example a potting compound sold under the trade name Tough Seal 21. Preferably the potting adhesive will be one that has strong adhesive properties with respect to aluminum.

Figure 6:
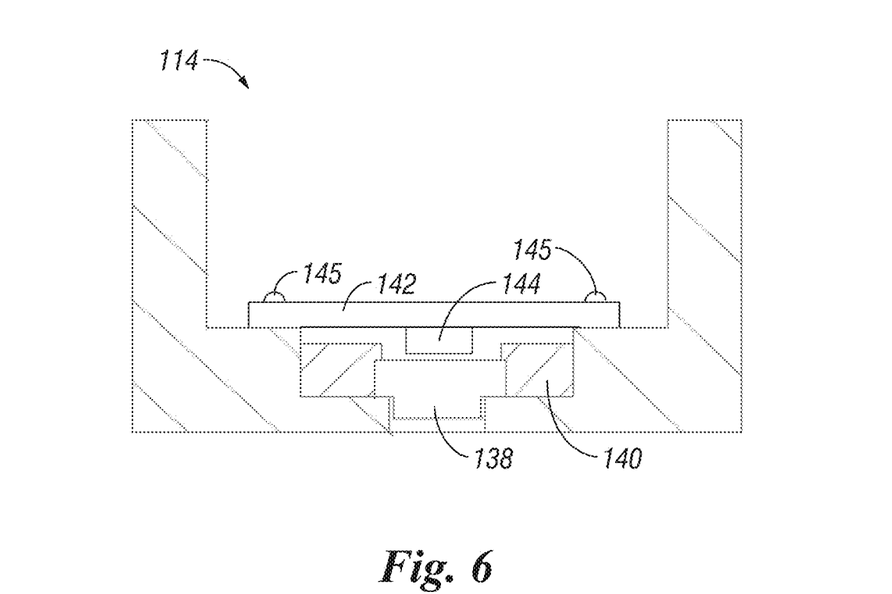
FIG. 6 shows the assembly of FIG. 5 with a circuit board including an LED light mounted in place on the aluminum body.

After the potting adhesive 140 has been allowed to dry, a circuit board 142 is installed on the body 114. The circuit board 142 includes a light emitting diode (LED) 144 that is in alignment with the lens 138. In practice the circuit board 142 may include more than one LED in alignment with more than one lens 138. The circuit board 142 may be secured to the body 114 with mechanical fasteners 145, for example threaded screws. Preferably the circuit board 142 will include the LEDs as surface mount devices in a solid state design. Those of ordinary skill in the art will be aware of numerous LED types that may be advantageously incorporated into the present invention.

Figure 7:
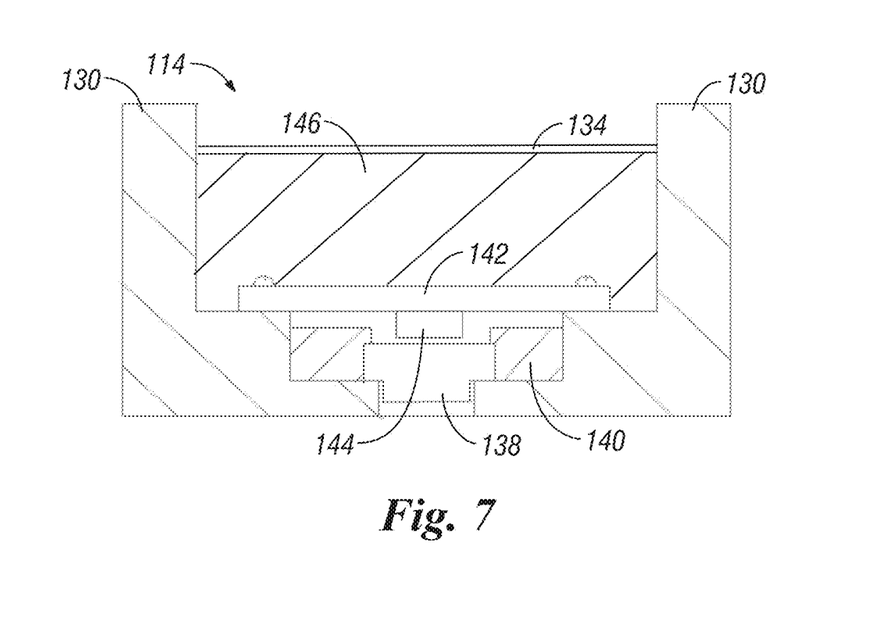
FIG. 7 shows the assembly of FIG. 6 wherein the rear cavity of the aluminum body has been filled with potting adhesive.

As seen in FIG. 7, after the circuit board 142 is installed a second layer of potting compound 146 is applied within the cavity 136 in order to substantially fill the cavity 136. The layer of potting compound 146 completely covers and protects the circuit board 142. The potting compound 146 completely protects the circuit board and lens from water and dust. Additionally, the potting compound 146 provides support and cushioning that will damp vibrations which can cause humming, and will protect the circuit board from impact stresses. The second layer of potting compound 146 may be the same or a different high elongation epoxy than is used in the potting adhesive 140 that secures the lens 138 in place. For example, the second layer of potting compound 146 may be a longer working time potting compound sold under the brand name Tough Seal 22.

Figure 8:
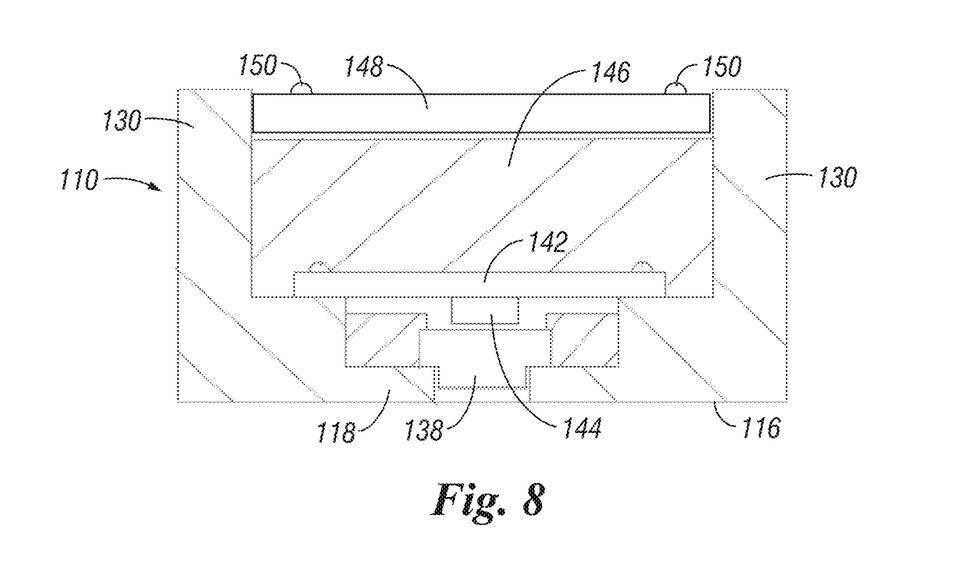
FIG. 8 is a cross sectional view of the elongated light bar of FIG. 3.

After the second layer of potting compound 146 is allowed to cure, a rear cover 148 may be secured to the body 114 by applying mechanical fasteners 150, which may be for example bolts or screws, to secure the rear cover 148 to the side walls 134. Mounting hardware 126 (see FIG. 3) may then be attached to the body 114 such that the lighted accessory 110 can be mounted to a vehicle.

The resulting lighted accessory 110 has significant advantages over existing designs. For example, the accessory 110 is low profile such that the overall dimension between the front face 116 and the back plate 148 may be no more than one and a half inches, and may be as little as three fourths of an inch. The fully potted rear cavity assures that the accessory 110 is well suited to withstand the rigors of outdoor use as it protects the circuit board 142 and LEDs 144 from water and from mechanical stresses. The potting compound 146 will absorb and damp the vibrations that can cause humming. The high density aluminum body 114 acts as an efficient heat sink to maintain the circuit boards 142 and LEDs 144 within an acceptable temperature range. The circuit boards 142 may include thermal control chips to regulate operation of the LEDs 144 in order to extend the life of the components.

If one of the circuit boards 142 should fail, it is possible to repair the lighted accessory 110. This can be accomplished by removing the back cover 148. The potting compound 146 that covers the non-functional circuit board 142 may be removed, for example by using a razor blade or other sharp instrument to slice out a portion of the potting compound 146 directly above the faulty circuit board 142. With a portion of the potting compound 146 removed, the circuit board 142 can be unscrewed from the body 114 and removed, and a new properly functioning circuit board 142 may be installed in its place. Additional potting compound may then be applied to fill in the gap within the potting compound 146 and again completely seal the new circuit board 142. After the new portion of potting compound has been allowed to completely cure, the back cover 148 may again be screwed into place, and the lighted accessory 110 may be reinstalled on the vehicle.

Figure 9A:
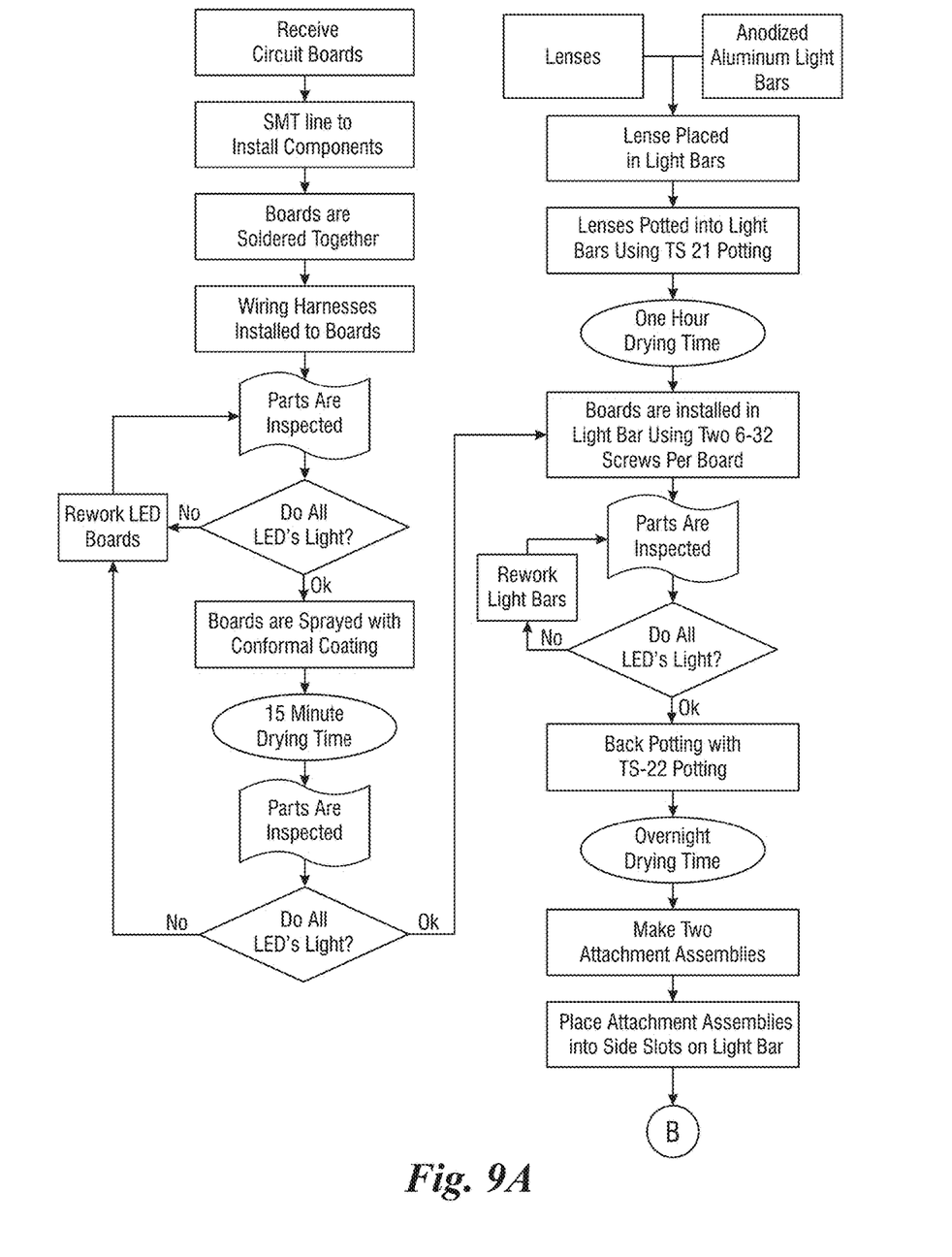
FIG. 9a is a first portion of a flow chart illustrating a process for assembling a lighted-vehicle accessory according to one embodiment of the present invention.
Figure 9B:
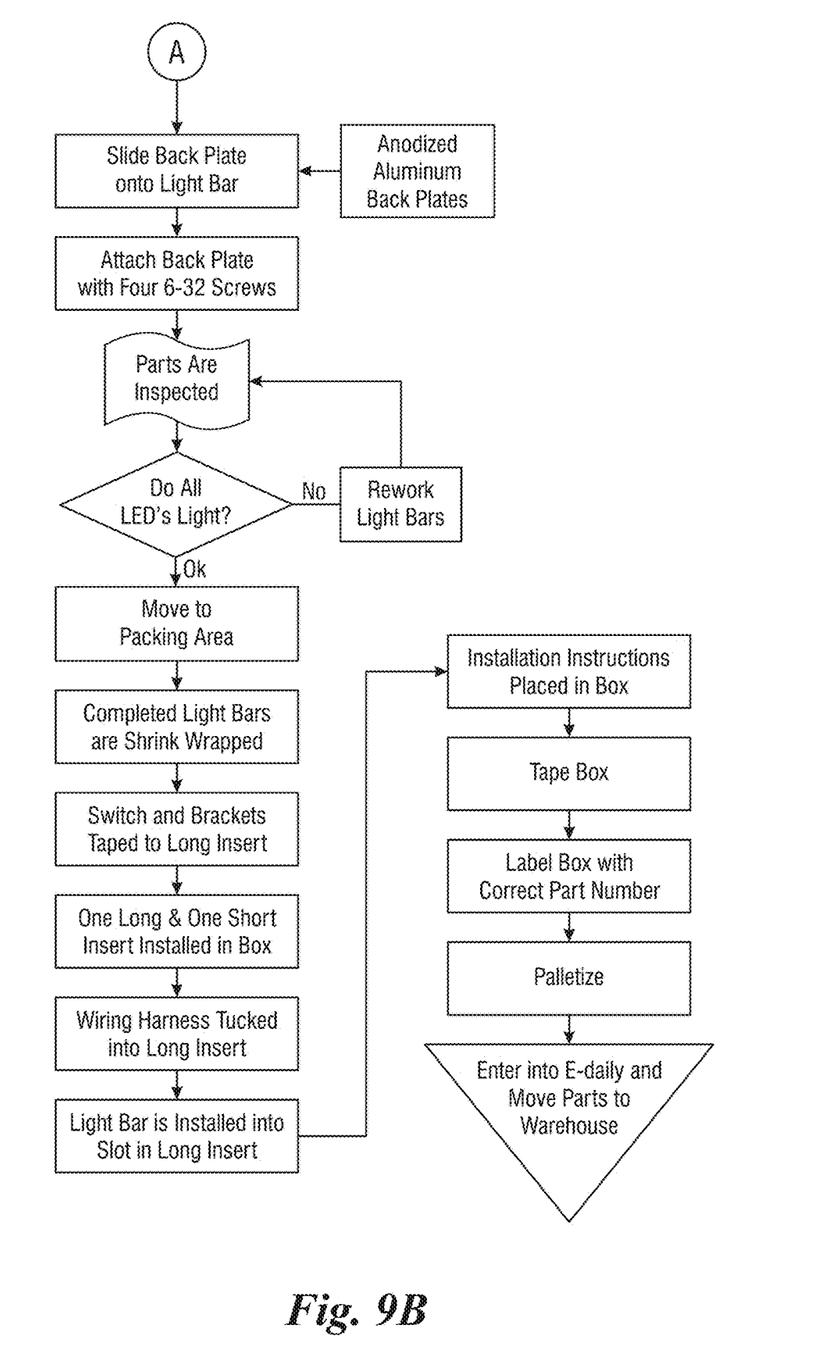
FIG. 9b is a second portion of the flow chart of FIG. 9b.
Figure 10:
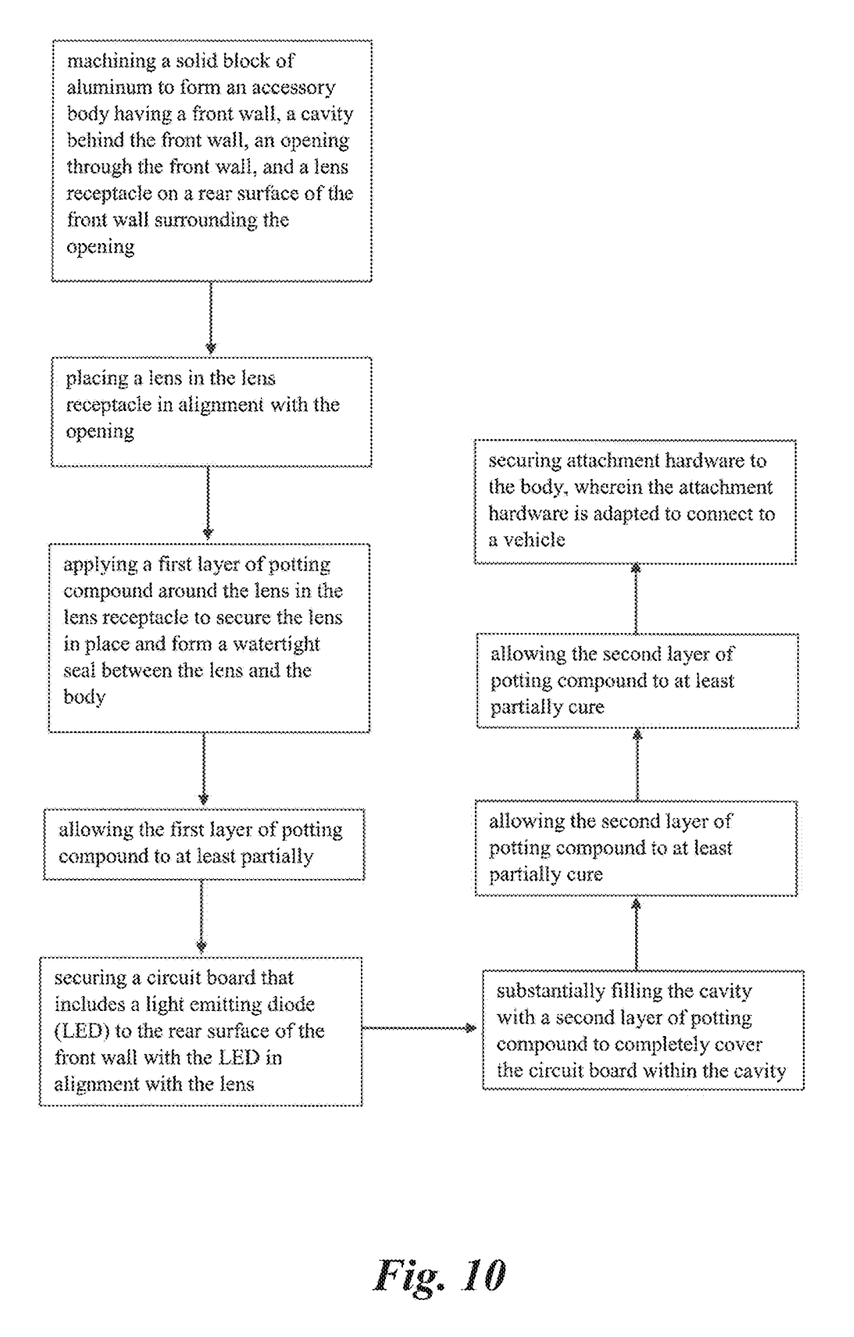
FIG. 10 is a flow chart illustrating a method of assembling a lighted vehicle accessory according to one embodiment of the present invention.
Figure 11:
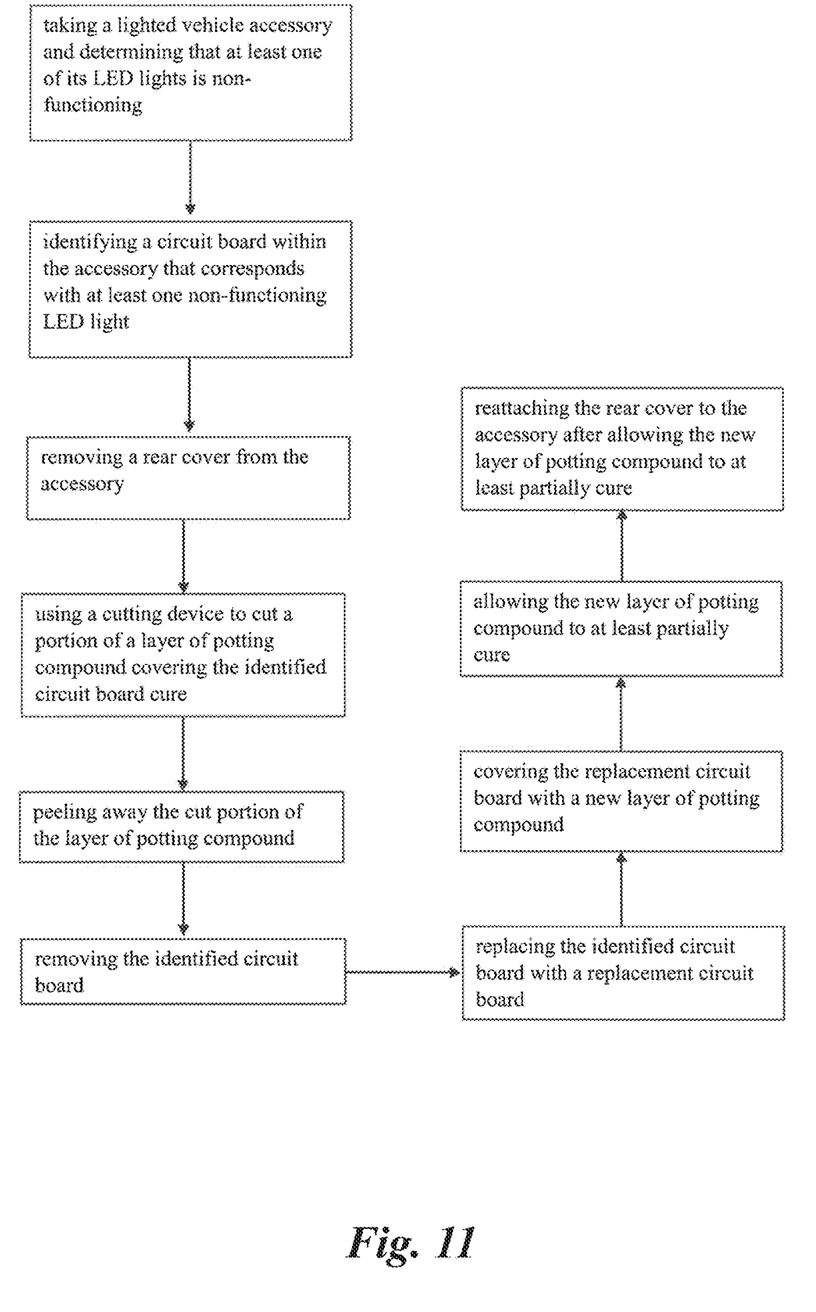
FIG. 11 is a flow chart of a method of repairing a lighted vehicle accessory that includes a plurality of circuit boards wherein one of the circuit boards is faulty.

FIGS. 9a and b are a flow chart illustrating a process for assembling a lighted-vehicle accessory according to one embodiment of the present invention.

The invention has been shown and described above with the preferred embodiments, and it is understood that many modifications, substitutions, and additions may be made which are within the intended spirit and scope of the invention. From the foregoing, it can be seen that the present invention accomplishes at least all of its stated objectives.

We claim:

1. An LED accessory for a vehicle, the accessory comprising:
    a solid body including a front wall and a cavity behind the front wall, the front wall having a plurality of openings;
    a plurality of lenses, each of the lenses being located within one of the plurality of openings;
    a first layer of potting compound forming a watertight seal between the lenses and the front wall;
    a circuit board having plurality of light emitting diodes (LEDs) in alignment with the lenses;
    a second layer of potting compound covering the circuit board, substantially filling the cavity, and configured to provide support and cushioning to damp vibrations in the circuit board;
    a back cover secured to the body and covering the second layer of potting compound;
    an attachment assembly secured to the body and adapted to attach the body to a vehicle; and
    a wire harness electrically connected to the circuit board and adapted to attach to an electrical system of the vehicle.

2. The LED accessory of claim 1, wherein the body is formed from a single piece of high density anodized aluminum.

3. The LED accessory of claim 2, wherein the first layer of potting compound has strong adhesive properties with respect to aluminum.

4. The LED accessory of claim 2, wherein the single piece of high density anodized aluminum is configured to act as a heat sink for the circuit board and LEDs.

5. The LED accessory of claim 1, wherein the LEDs are surface mount devices.

6. The LED accessory of claim 1, wherein the first and second layers of potting compound are high elongation epoxies.

7. The LED accessory of claim 6, wherein the second layer of potting compound is a longer working time potting compound than the first layer of potting compound.

8. The LED accessory of claim 1, wherein the first layer of potting compound is applied around the periphery of the lens within a lens receptacle, the lens receptacle being a recessed area machined into the front wall.

9. The LED accessory of claim 1, wherein the second layer of potting compound completely covers the circuit board.

10. The LED accessory of claim 1, wherein the circuit board includes thermal control chips to regulate operation of the LEDs.

11. The LED accessory of claim 1, wherein each opening of the plurality of openings is machined at a right angle to a front face of the body, causing the lens to be oriented normally with respect to the front face.

12. The LED accessory of claim 11, wherein the distance between the front face and the back cover may be no less than three fourths of an inch and no more than one and a half inches.

13. The LED accessory of claim 1, wherein each opening of the plurality of openings is machined at an oblique angle relative to a front face of the body, causing light to be directed into the lens in a direction other than a right angle with respect to the front face.

* * * * *